(12) United States Patent
Wood et al.

(10) Patent No.: US 9,871,119 B2
(45) Date of Patent: Jan. 16, 2018

(54) METHOD OF MANUFACTURING A TERMINATION ARRANGEMENT FOR A VERTICAL MOSFET

(71) Applicant: Infineon Technologies Austria AG, Villach (AT)

(72) Inventors: Andrew Wood, St. Jakob im Rosental (AT); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 59 days.

(21) Appl. No.: 14/552,381

(22) Filed: Nov. 24, 2014

(65) Prior Publication Data
US 2015/0079749 A1    Mar. 19, 2015

Related U.S. Application Data

(62) Division of application No. 13/478,038, filed on May 22, 2012, now Pat. No. 8,896,047.

(51) Int. Cl.
| | |
|---|---|
| H01L 21/765 | (2006.01) |
| H01L 29/66 | (2006.01) |
| H01L 29/78 | (2006.01) |
| H01L 29/06 | (2006.01) |
| H01L 21/265 | (2006.01) |
| H01L 21/28 | (2006.01) |
| H01L 29/40 | (2006.01) |
| H01L 29/417 | (2006.01) |
| H01L 29/423 | (2006.01) |
| H01L 29/10 | (2006.01) |

(52) U.S. Cl.
CPC ...... *H01L 29/66704* (2013.01); *H01L 21/265* (2013.01); *H01L 21/28008* (2013.01); *H01L 21/765* (2013.01); *H01L 29/0661* (2013.01); *H01L 29/66734* (2013.01); *H01L 29/7811* (2013.01); *H01L 29/7813* (2013.01); *H01L 29/1095* (2013.01); *H01L 29/402* (2013.01); *H01L 29/407* (2013.01); *H01L 29/41766* (2013.01); *H01L 29/423* (2013.01); *H01L 29/42372* (2013.01)

(58) Field of Classification Search
None
See application file for complete search history.

(56) References Cited

U.S. PATENT DOCUMENTS

| | | | | |
|---|---|---|---|---|
| 6,031,265 | A * | 2/2000 | Hshieh | H01L 29/1095 257/334 |
| 2003/0085422 | A1* | 5/2003 | Amali | H01L 29/407 257/329 |
| 2006/0035422 | A1 | 2/2006 | He et al. | |
| 2009/0267143 | A1* | 10/2009 | Hsieh | H01L 29/0619 257/331 |

(Continued)

FOREIGN PATENT DOCUMENTS

DE    102011075601 A1    11/2011

*Primary Examiner* — Bilkis Jahan
(74) *Attorney, Agent, or Firm* — Murphy, Bilak & Homiller, PLLC

(57) ABSTRACT

Representative implementations of devices and techniques provide a termination arrangement for a transistor structure. The periphery of a transistor structure may include a recessed area having features arranged to improve performance of the transistor at or near breakdown.

21 Claims, 11 Drawing Sheets

(56) References Cited

U.S. PATENT DOCUMENTS

| | | | |
|---|---|---|---|
| 2011/0272735 A1* | 11/2011 | Schmidt | H01L 29/0661 257/139 |
| 2013/0168761 A1* | 7/2013 | Hsieh | H01L 29/407 257/330 |
| 2014/0210000 A1* | 7/2014 | Tokuda | H01L 29/7811 257/330 |

* cited by examiner

METHOD OF MANUFACTURING A TERMINATION ARRANGEMENT FOR A VERTICAL MOSFET

RELATED APPLICATIONS

This application is a divisional application of copending U.S. patent application Ser. No. 13/478,038, filed on May 22, 2012. The entire contents of the copending US patent application are hereby incorporated herein by reference.

BACKGROUND

A transistor structure may include a termination region on one or more outside edges of the active region of the structure. In the termination region of a power transistor, such as a metal-oxide-semiconductor (MOSFET) device, regions of high electric field develop under the application of high drain voltages. Once the electric field reaches a critical level, impact ionization of the transistor materials in the high field region can generate large quantities of carriers, leading to avalanche breakdown of the device. The drain voltage at which this avalanche process occurs is the breakdown voltage (BVdss) of the device. The breakdown voltage is an important characteristic of the device, especially when considering possible applications for the device.

The spatial location and the distribution of the electric field developed during breakdown are also important. For example, in device structures that include trenches in the termination region, a high magnitude electric field often occurs at the corners of the trenches. This electric field can promote carrier injection into the insulating regions nearby. When injected carriers are trapped in the insulating regions, they can cause trapped electric charge to accumulate in these insulating regions. This can result in drift of the device's electrical parameters (e.g., breakdown voltage, on-resistance, threshold voltage, etc.). It can also result in a reduced time to breakdown of the insulating material in this region or shorten the life of the device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
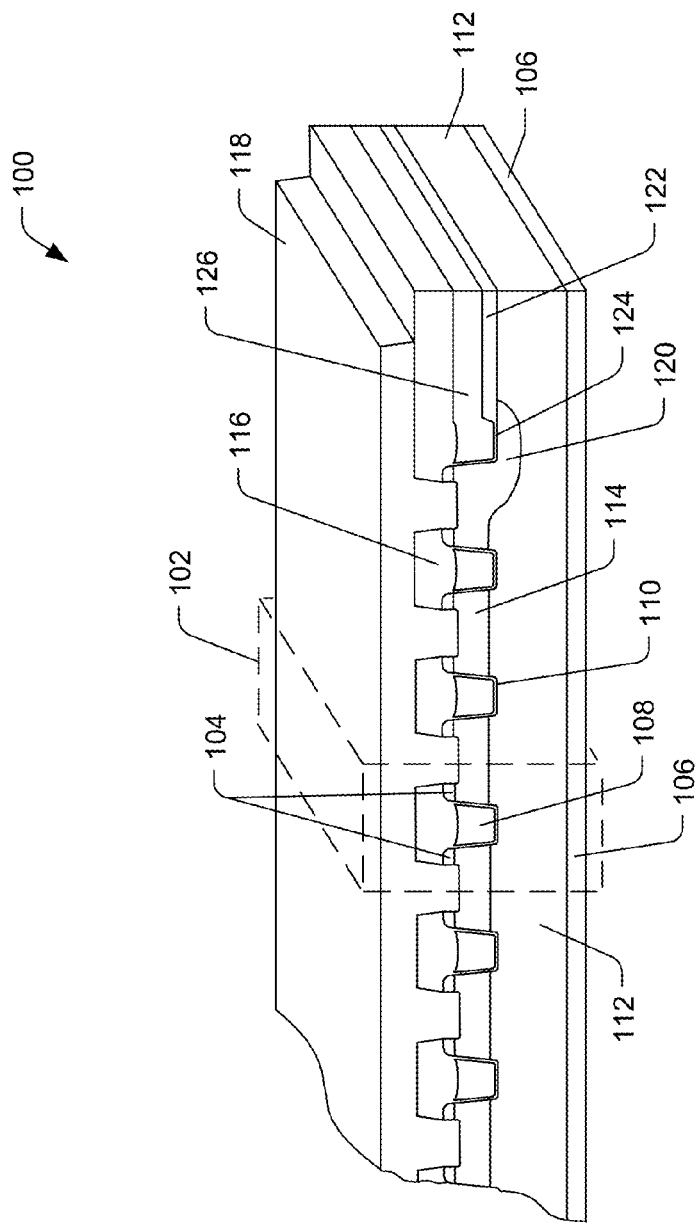
FIG. 1 is a perspective view of a portion of an example transistor structure, according to an implementation. The portion of the example transistor structure is shown to highlight detail at the edge of the transistor structure.

Representative implementations of devices and techniques provide a termination arrangement for a transistor structure. The periphery of a transistor structure may include a recessed area having features arranged to improve performance of the transistor at or near breakdown.

In one implementation, a deep body is implanted in the recessed area of the termination region that is electrically connected to the active region of the transistor structure. The deep body effects electrical fields developed during breakdown, resulting in an increased breakdown voltage and/or a reduction in the electric field across the insulating region within the termination region. In another implementation, the deep body causes a reduction or a removal of the hole current path from the semiconductor-insulator interface.

In an implementation, a field plate structure is disposed over a gate insulator/field insulator step located at the recessed area of the termination region. In various other implementations, other structures may be included in the termination region, and affect the location, intensity, distribution, etc. of electric fields developed during breakdown. Additionally, in some implementations, one or more deep body regions may be located in the active cell region of the transistor structure, and arranged to "steer" currents in desired paths.

Various implementations and arrangements for a transistor termination are discussed in this disclosure. Techniques and devices are discussed with reference to example vertical-channel metal-oxide-semiconductor field-effect transistor (MOSFET) devices illustrated in the figures. However, this is not intended to be limiting, and is for ease of discussion and illustrative convenience. The techniques and devices discussed may be applied to any of various transistor device designs, structures, and the like (e.g., metal-insulator-semiconductor FET (MISFET), metal-semiconductor FET (MESFET), insulated-gate FET (IGFET), insulated-gate bipolar transistor (IGBT), high-electron mobility transistor (HEMT) or (HFET), modulation-doped FET (MODFET), etc.), as well as other semiconductor devices (e.g., semiconductor diodes, etc.), and remain within the scope of the disclosure. For ease of discussion, the generic term "transistor" is used herein for all such devices.

Advantages of the disclosed techniques and devices are varied, and include: 1) minimized injection of carriers into and trapping of carriers by insulating regions, thus providing improved stability of device parameters; 2) higher device breakdown voltage; 3) reduced electric fields during breakdown; 4) better distribution of the electric fields during breakdown; 5) reduced electric field across insulating regions; 6) low resistance paths for avalanche hole current to the body contact; and 7) improved device lifetime and robustness. Other advantages of the disclosed techniques may also be present.

Implementations are explained in more detail below using a plurality of examples. Although various implementations and examples are discussed here and below, further implementations and examples may be possible by combining the features and elements of individual implementations and examples.

Example Transistor Structure

FIG. 1 is a perspective view of a portion of an example transistor structure 100, according to an implementation. The portion of the example transistor structure 100 illustrates a number of transistor cells 102 and highlights detail at the edge of the transistor structure 100. The techniques, components, and devices described herein with respect to the transistor structure 100 are not limited to the illustration in FIG. 1, and may be applied to other transistor structure designs without departing from the scope of the disclosure. In some cases, additional or alternative components may be used to implement the techniques described herein. It is to be understood that a transistor structure 100 may be implemented as stand-alone device or as part of another system (e.g., integrated with other components, systems, etc.).

The illustrated transistor structure 100 in FIG. 1 is shown and described as including a transistor "cell" 102. An example cell 102 is bounded by a dashed outline, and is considered to contain most or all components of a single transistor. For example, a cell 102 may include a source region 104, a first drain region 106, a gate structure 108, a semiconductor layer 112 (also referred to as a mass, bulk, second drain region, etc.), and a body layer 114 (e.g., channel forming layer, etc.), and be operative as a transistor. In some implementations, however, as described below, a cell 102 may not include all of the components of a single transistor. For example, in some cases, a cell 102 may not have a source region 104 and may not be an operative transistor. Such a cell 102 without a source region 104 may still include a p-n junction diode which is operative under certain operating conditions. In alternate implementations, a cell 102 may include alternate or additional components, or may have different boundaries.

A transistor structure 100 may contain one cell 102 or multiple cells 102. In some implementations, multiple cells 102 may be used together in a transistor structure 100 to minimize cost and die area while maximizing the channel density of the transistor structure 100. In various implementations, a transistor structure 100 may be comprised of multiple cells 102 that are arranged in rows, matrices, and the like. Accordingly, cells 102 may have various shapes, including strips, polygons, and so forth. In some implementations, cells 102 may have irregular shapes.

Figure 2:
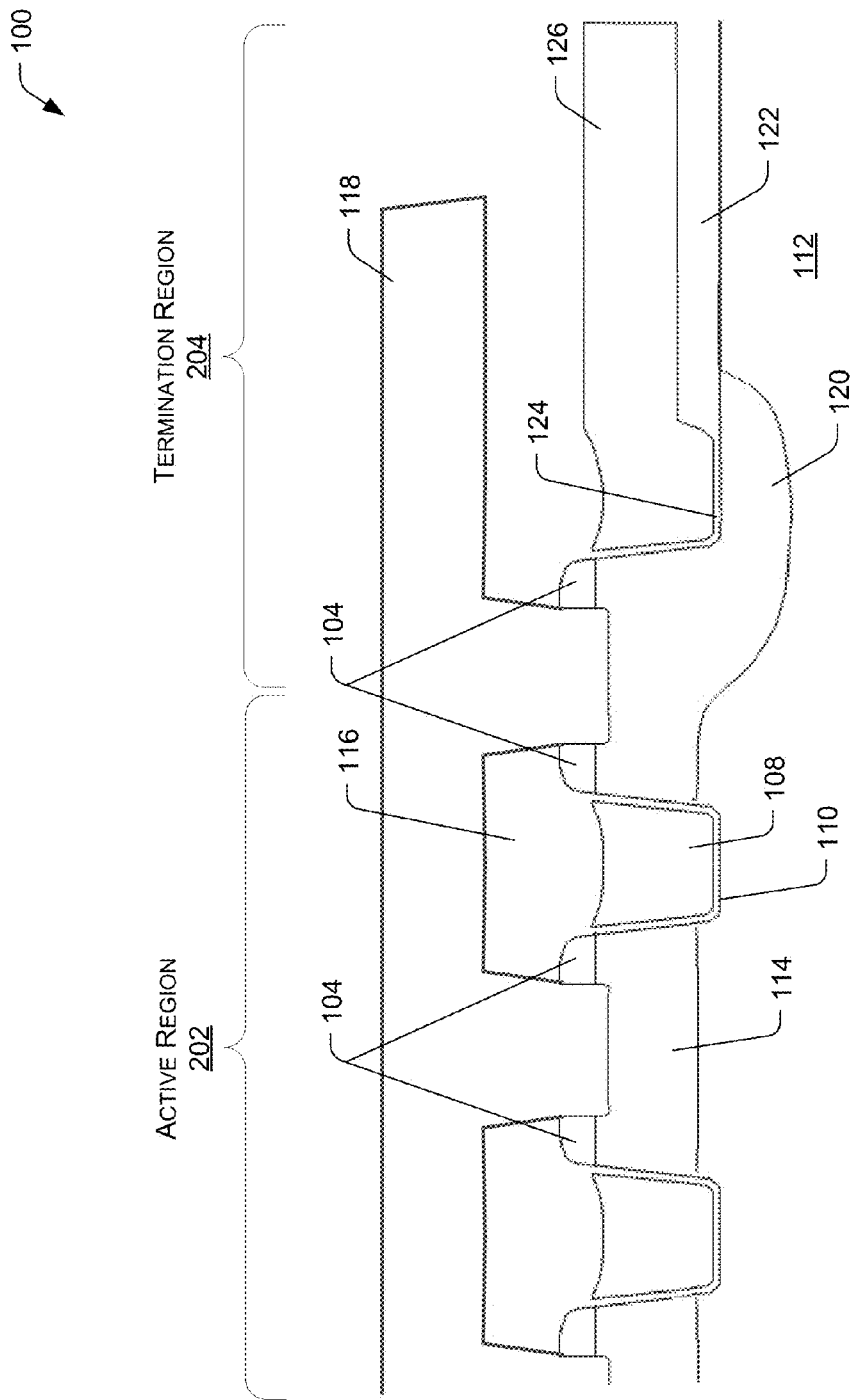
FIG. 2 is a profile view of a portion of the example transistor structure of FIG. 1, according to an implementation.

FIG. 2 is a profile view of a portion of the example transistor structure 100 of FIG. 1, according to an implementation. Not all components from FIG. 1 are illustrated in FIG. 2 for clarity and ease of discussion. As shown in FIG. 2, a transistor structure 100 may be discussed in terms of an active region 202 and a termination region 204. The delineation of the active region 202 and the termination region 204 as illustrated in FIG. 2 is generalized for discussion purposes. In various implementations, the active region 202 and/or the termination region 204 may include more or less of the transistor structure 100. Further, the regions (202, 204) may overlap at one or more locations.

In one implementation, the termination region 204 is arranged at a periphery of a matrix of transistor cells 102. For example, the termination region 204 may be located at the edge of a transistor structure 100, as discussed further below. In an alternate implementation, the termination region 204 may be located towards the interior or center of a transistor structure 100 or a matrix of cells 102. For example, a sensing device or the like may be located in the midst of a matrix of transistor cells 102, and a termination region 204 may be located between the sensing device and the transistor cells 102.

In an implementation, the termination region 204 is electrically coupled to the active region 202. In one implementation, the termination region 204 is electrically coupled to the active region 202 via a source bus (such as source bus structure 118, for example) as well as through the semiconductor layer 112.

As shown in FIGS. 1 and 2, a transistor structure 100 may include one or more gate trenches 110. In various implementations, gate trenches 110 may be etched, imprinted, or otherwise cut into one or more layers of the transistor structure 100. In an implementation, a gate structure 108 may be disposed (e.g., buried, entrenched, embedded, etc.) in a gate trench 110. In various implementations, the gate trench 110 and/or the gate structure 108 may have different shapes and dimensions. In some implementations, the shape and dimensions of the gate trench 110 and/or gate structure 108 may influence the shape and intensity of electric fields developed during current flow. Additionally or alternatively, the depth of the gate trench 110 relative to the body of the transistor structure 100 or to elements of the transistor structure 100 may influence the shape and intensity of electric fields developed during current flow. The gate structure 108 may be formed from polysilicon or from an alternative conductive or semiconducting material.

In one implementation, the active region 202 includes one or more active transistor cells 102. For example, the active region 202 may include one or more vertical channel transistor cells 102, where the gate structure 108 is embedded in a trench 110, where the cells include a source region 104, and where the cells 102 perform as transistors. In one implementation, the active region is comprised of one or more mesas (e.g., mounds, plateaus, etc.) separated by trenches 110. In various implementations, the mesas include the cells 102.

In one implementation, a transistor structure 100 comprises an active region 202 including a first plurality of transistor cells or mesas. Each of the first plurality of transistor cells has a source region 104, a trench 110, and a gate structure 108 disposed in the trench 110. In another implementation, the transistor structure 100 comprises a termination region 204 including a second plurality of transistor cells or mesas. The second plurality of transistor cells are arranged at a periphery of the active region 202 and have electrical connectivity with one or more transistor cells of the first plurality of transistor cells. In one implementation, the transistor cells of the second plurality of transistor cells have a width substantially equal to a width of the transistor cells of the first plurality of transistor cells.

Figure 3:
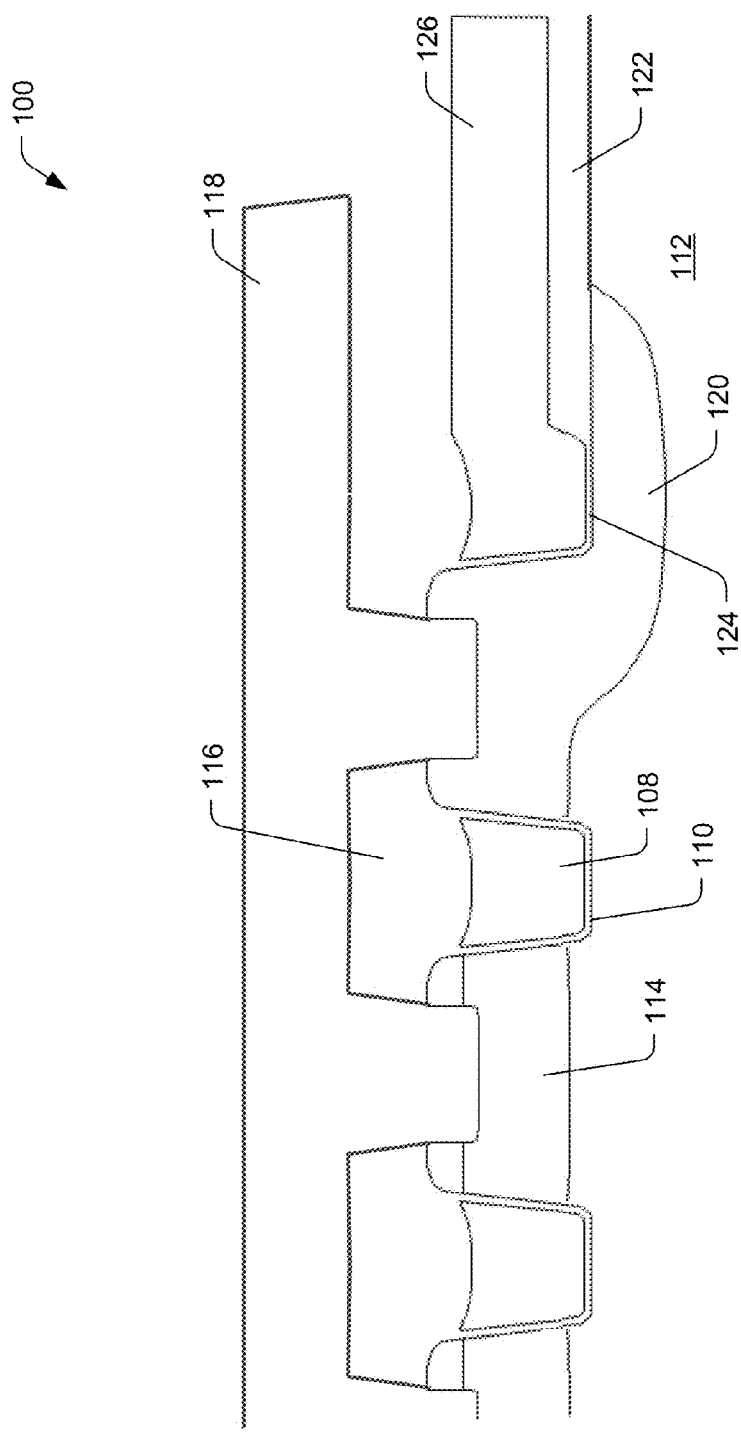
FIG. 3 is a profile view of a portion of the example transistor structure of FIG. 1, without a source layer in at least one cell region, according to another implementation.

As shown in FIG. 2, in an implementation, the transistor structure 100 may include a source layer 104 disposed on portions of the active region 202 and the termination region 204. However, in another implementation, as shown in FIG. 3, the transistor structure 100 may include a source layer 104 disposed on portions of the active region 202, but the termination region 204 may be devoid of a source layer 104. For example, one or more of the transistor cells 102 may be devoid of a source region 104. In such an implementation, the transistor cells 102 not having a source layer 104 are not active cells. Thus, the termination region 204 may contain active cells and/or inactive cells. Active cells contain a channel region which can be switched into a conducting or low-resistance state through application of a voltage to the gate structure 108. Inactive cells cannot be switched into a low resistance state through application of a voltage to the gate structure 108, but may still conduct current during other operating conditions, such as avalanche breakdown of the device, or operation in a reverse polarity condition, for example.

As shown in FIG. 1, a transistor structure 100 may also include a semiconductor layer 112, a doped body layer 114, an insulating layer 116, and a source contact structure 118. In various implementations, the gate trench 110 may be entrenched into the body layer 114 and may extend partly into the semiconductor layer 112. In one implementation, a contact region for the source contact structure 118 is formed by a groove in the mesa surface. In one example, the groove penetrates the source layer 104 and the body layer 114, as shown in FIG. 2. In another implementation, a contact structure 118 may be formed by a contact to the surface of a mesa, the surface having a first part or parts which contains the source layer 104, and a second part or parts in which the body layer 114 extends to the said surface.

In various implementations, the semiconductor layer 112 may comprise a p-type or an n-type semiconductor material, for example. In the implementations, the source 104 and the drain 106 may comprise the same type (but opposite polarity) of semiconductor material and the body layer 114 may comprise an opposite type (and opposite polarity) of semiconductor material. The semiconductor regions may, for example, comprise regions of silicon, germanium, silicon carbide, gallium nitride, or another material having semiconducting properties. In some implementations, the source contact structure 118 and the gate structure 108 are a conductive material, such as a metal, for example. In other implementations, the gate structure 108 may be comprised of a conductive poly-silicon material. Accordingly, the insulating layer 116 is comprised of an insulating material, such as a silicon-oxide, silicon dioxide, silicon oxynitride, or some other material which is electrically insulating.

Example Termination Arrangement

In various implementations, the transistor structure 100 may be designed such that an electric field for a given drain voltage is reduced (resulting in a higher breakdown voltage) and/or that the electric field is distributed to minimize the electric field across insulating regions of the transistor structure 100. Additionally or alternatively, the flow of the avalanche hole current can be designed to follow a low resistance path to a body contact, and one or both of the hole current to the body contact and the electron flow to the drain contact are steered to avoid regions of high electric field directed towards insulating regions. This steering can minimize injection of carriers into and trapping of carriers by insulating regions.

Designs to control the magnitude and/or shape of an electric field under high applied drain bias may include a termination arrangement in the termination region 204 of the transistor structure 100. This may include the use of structures, materials, geometry, and the like, in the termination region 204, such as implanted junctions and/or rounding of the trench corners in devices containing trenches. For example, one implementation includes a deep body region connected to the edge of one or more of the outermost mesas.

As seen in FIGS. 1 and 2 and discussed further below, in some implementations having trenches, a termination arrangement consisting of implanted regions outside of the outermost trench may be used. For example, the semiconductor material(s) in the termination region 204 may be etched to the same or similar depth as the trenches in the active cell region 202. This can create a substantially planar termination region 204 devoid of p-n junctions. In alternate implementations, a termination region 204 has a semiconductor surface which lies deeper than the source body junction and/or the middle of the channel region and/or the body drain junction in a cell 102 within the active region 202. In one implementation, the termination region 204 has a semiconductor surface (e.g., edge trench) that is recessed to a deeper depth in comparison to the trenches 110 in the active region 202.

An example termination arrangement is described with reference to FIGS. 1 and 2. As shown in FIGS. 1 and 2, a transistor structure 100 may have a termination arrangement at one or more edges or at a periphery of the transistor structure 100. The termination arrangement may be part of the termination region 204 on one or more outside edges of the active region 202 of the transistor structure 100. In some implementations, the termination arrangement may define the outside edge(s) of the transistor structure 100. In alternate implementations, the termination arrangement may be located within interior or central portion(s) of a transistor structure 100, as described previously. For example, a termination arrangement may separate the transistor structure 100 from other structures, such as sensors, passive components, further transistor structures, micro-electromechanical structures (MEMS), or the like, providing a region between transistor cells 102 and the other device(s) that may be located within the interior portions of the transistor structure 100. In various implementations, the termination arrangement may include structures, materials, geometry, and the like, at one or more of the outside edges of the transistor structure 100 or within one or more interior regions of the transistor structure 100.

Generally, the semiconductor layer 112 extends from the active region 202 through the termination region 204. In one implementation, the termination region 204 includes a recessed portion or a recessed trough. The recessed portion may be described as an edge trench extending to the edge of the transistor structure 100. In one implementation, the edge trench extends to the edge of the chip that the transistor structure is located on.

Generally, the body layer 114 is disposed over the upper surface of the semiconductor layer 112 in the active region 202. In one implementation, the body layer 114 extends from the active region 202 onto the recessed portion of the termination region 204, forming an embedded portion or deep body 120, arranged for electric field protection and/or avalanche current path engineering. In various implementations, the deep body 120 in the termination region 204 is in direct electrical contact with at least one mesa at the termination region 204 and/or at least one mesa at the active region 202.

In alternate implementations, the mesas at the termination region 204, adjacent to the deep body region 120, can be made with or without an active source region 104. Removing the source region 104 can lead to removal of the parasitic bipolar transistor in the outermost mesas, and this can increase the avalanche current capability of the outermost mesas. In another implementation, the outermost mesas or cells 102 (in the termination region 204) can have the same width as the adjacent active area mesas or cells 102 (in the active region 202). In the implementation, the outermost mesas or cells 102 do not need to have an increased width to incorporate the termination features described herein.

In an implementation, the deep body 120 is contiguous with the body layer 114 of a cell 102 at the edge of the termination region 204. In another implementation, a deep body 120 is present in a number of edge cells 102. For example, several edge cells 102 or mesas may include an adjacent deep body region 120. In one example, the deep body 120 is formed as an integral part of one or more edge mesas. In an implementation, a deep body region 120 is coupled to one or more transistor cells 102 of the second plurality of transistor cells discussed above (e.g., in the termination region 204) and is located at a recessed trough at a periphery of the termination region 204.

The deep body 120 is referred to as a "deep body" based on the tendency for the deep body 120 to be located deep within the transistor structure 100. For example, in one implementation, the deep body 120 penetrates the semiconductor layer 112 to a greater depth than a depth of the trench(es) 110. In various implementations, the deep body 120 is adjacent to a deep lying gate insulator/field insulator transition area, as discussed below.

In one implementation, as shown in FIG. 2, the deep body 120 is coupled to at least one transistor cell 102 at the periphery of a matrix of transistor cells. For example, the deep body region 120 is electrically connected through the contact structure present on the outermost mesas or cells 102. Thus, in some implementations, the deep body region 120 is formed as an integral part of the edge mesas, and the deep body 120 does not require a separate contact.

In one implementation, a field insulator layer is disposed partly on the recessed portion of the termination region 204 (e.g., at the deep body 120) and partly on the semiconductor layer 112 in the termination region 204, forming an insulator step structure 122. For example, the result is an insulator step structure 122 disposed over a preselected portion of the implanted deep body 120. Thus, in various implementations, the deep body extends at least to the insulator step 122 in the termination region 204.

Referring to FIGS. 1 and 2, in one implementation, a layer of thin gate insulator 124 is formed partly on a portion of the transistor cell 102 and partly on a portion of the semiconductor layer 112 in the termination region 204. In an implementation, the layer of thin gate insulator 124 has the same thickness as the gate insulator in the active region 202, insulating the entrenched gate structure(s) 108. In another implementation, the thin insulator region 124 is wider than the width of a trench in the active region 202. In a further implementation, the thin insulator region 124 is wider than the spacing between a mesa sidewall and a contact groove cut into a mesa top surface to accommodate the source contact 118. In an implementation, the thin insulator region 124 extends to an edge of the chip. In another implementation, the deep body region 120 extends to a distance from an edge mesa greater than or equal to the width of the gate insulator region 124.

In an implementation, the field insulator layer 122 and the gate insulator layer 124 meet in the termination region 204 at a field insulator/gate insulator junction. In an implementation, this junction comprises the insulator step structure. In various implementations, the field insulator layer 122 and/or the gate insulator layer 124 are comprised of an insulating material, such as a silicon-oxide, silicon dioxide, silicon oxynitride, or some other material which is electrically insulating.

In an implementation as shown in FIGS. 1 and 2, the transistor structure 100 includes a semiconductor field plate structure 126 overlying the gate insulator layer 124 and the field insulator layer 122 in the termination region 204. The field plate structure 126 may overlay the insulator step structure 122 as well as a portion of, or all of, the deep body 120. In an implementation, the thin insulator layer 124 is formed between the field plate structure 126 and the deep body 120.

In one implementation, the field plate structure 126 is formed from the same or similar polysilicon material as the gate structure 108. In one example, the polysilicon of the field plate structure 126 in the termination region 204 is contiguous with the gate structure 108 polysilicon in the cell region 102. In such an implementation, no further electrical connection to the field plate structure 126 is required. In alternate implementations, the field plate structure 126 is formed of another material that is conductive or semi-conductive.

In various implementations, additional or alternative components may be used to accomplish the disclosed termination techniques and arrangements.

Example Implementations

Figure 4:
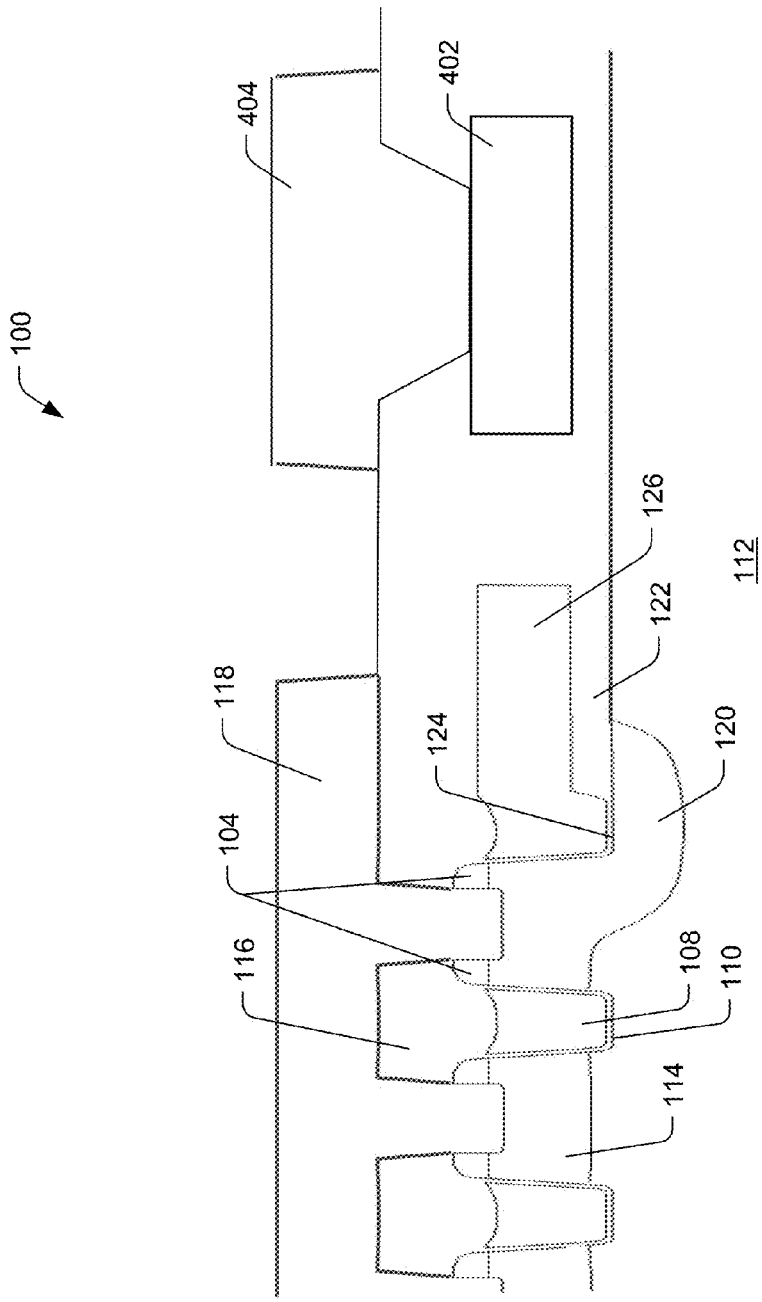
FIG. 4 is a profile view of a portion of the example transistor structure of FIG. 1, including an example gate runner structure, according to an implementation.

FIG. 4 is a profile view of a portion of the example transistor structure 100, including an example gate runner structure 402, according to an implementation. For example, in an implementation, the termination region 204 includes a semiconductor gate runner structure 402 overlying the recessed trough at the termination region 204, outside of the field plate structure 126 region. In one implementation, the termination region 204 is made wider to accommodate the gate runner structure 402.

In an implementation, the gate runner structure 402 assists in the connection of the gate bias applied to the transistor structure 100 to the gate structure 108 in the active transistor region 202 (similar to a bus, for example). In some implementations, the gate runner structure 402 reduces the gate impedance of the transistor structure 100, which may increase the switching speed of the device. In some implementations, the gate runner structure 402 reduces spatial variations in the gate bias appearing at the gate structure 108 in the various trenches in the active transistor region 202.

In various implementations, the gate runner structure 402 comprises a conductive or semi-conductive material. In one implementation, the gate runner structure 402 comprises a same material as the field plate structure 126. The gate runner structure 402 may be located at one or more edges of the transistor structure 100. In one implementation, the gate runner structure 402 is located around all or nearly all of the periphery of the transistor structure 100.

In an implementation, the gate runner structure 402 is coupled to a voltage source via a terminal 404. In some implementations, the terminal 404 is coupled to the gate structure 108 for the transistor structure 100. In alternate implementations, the gate runner 402 is coupled to another potential via the terminal 404. In various implementations, the terminal 404 may be comprised of a metal, reducing the impedance of the terminal 404, or it may be comprised of another conductive or semiconductive material.

As shown in FIG. 4, the gate runner structure 402 may be insulated from the semiconductor layer 112 by an insulating material, such as an oxide, for example. In one implementation, the field insulator at 122 extends to the gate runner 402 area and insulates the gate runner structure 402 from the semiconductor layer 112.

Figure 5:
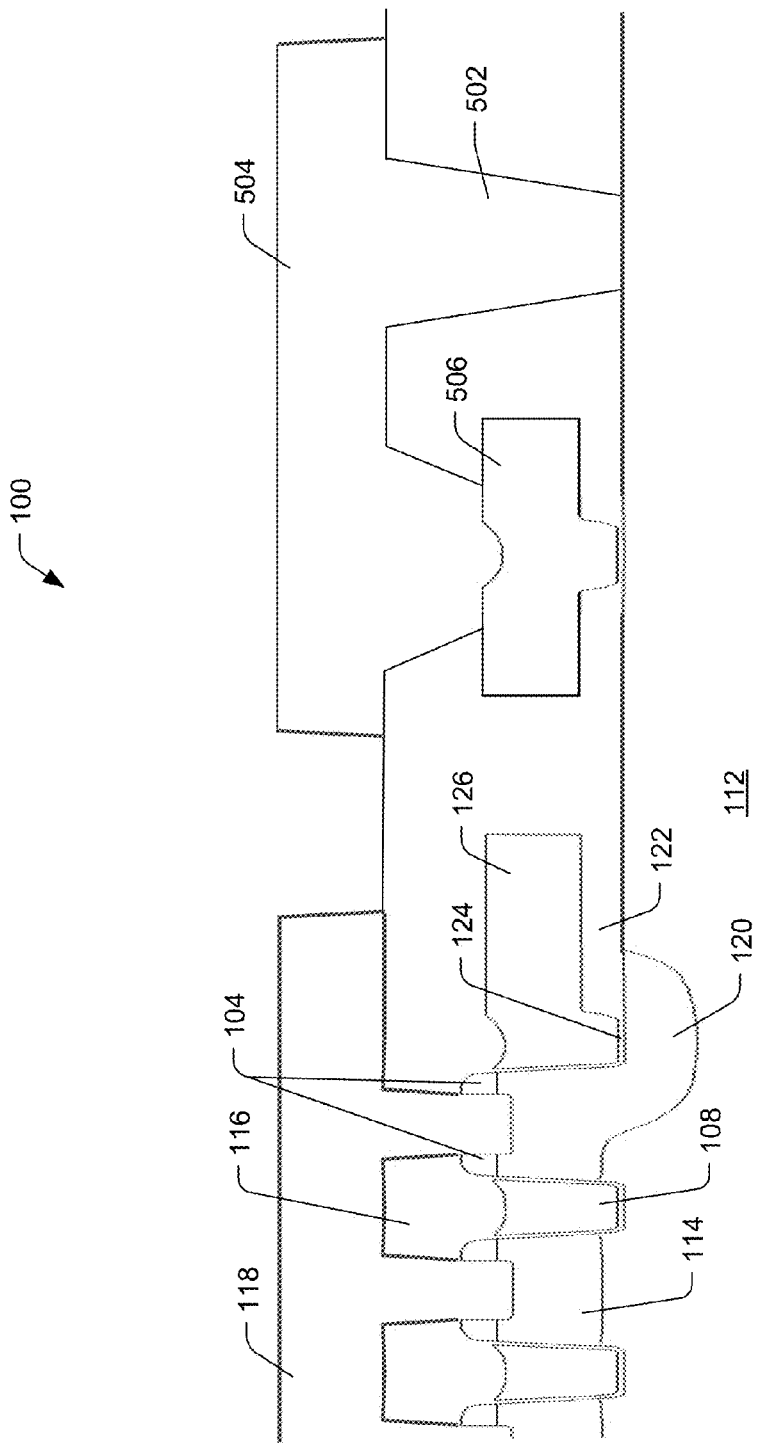
FIG. 5 is a profile view of a portion of the example transistor structure of FIG. 1, including an example channel stopper structure, according to an implementation.

FIG. 5 is a profile view of a portion of the example transistor structure 100, including an example channel stopper, or guard ring structure 502, according to an implementation. For example, in an implementation, the termination region 204 includes a semiconductor channel stopper structure 502 disposed at a periphery of the termination region 204. In one implementation, the termination region 204 is made wider to accommodate the channel stopper structure 502.

In an implementation, the channel stopper structure 502 assists in adjusting the size, shape, or location of an electric field in the vicinity of the region 506 (e.g., near the edge of the transistor structure 100). In some implementations, the channel stopper structure 502 prevents the formation of a conducting channel at the surface of the semiconductor layer 112 in the termination region 204, inhibiting the flow of unwanted currents.

In various implementations, the channel stopper structure 502 comprises a conductive or semi-conductive material, or a combination thereof. In one implementation, the channel stopper structure region 506 comprises a same material as the field plate structure 126. The channel stopper structure 502 may be located at one or more edges of the transistor structure 100. In one implementation, the channel stopper structure 502 is located around all or nearly all of the periphery of the transistor structure 100.

In an implementation, the channel stopper structure 502 is coupled to a voltage source via a terminal 504. In some implementations, the terminal 504 is coupled to the drain region 106 of the transistor structure 100. As shown in FIG. 5, this connection to the drain region 106 may be achieved through a contact to the semiconductor layer 112 at a gap in the insulating region 122. Contact with the semiconductor layer 112 brings the channel stopper structure 502 to the same potential as the semiconductor layer 112, and inhibits the flow of leakage current at or near the surface of the transistor structure 100 in the termination region 204. In alternate implementations, the channel stopper structure 502 is coupled to another potential via the terminal 504.

In one implementation, the channel stopper structure 502 may be a deep lying channel stopper structure 502, coupled to the semiconductor layer 112 at a point deeper than the surface of the mesas of the active region 202 of the transistor structure 100. In another implementation, the channel stopper structure 502 is coupled to the semiconductor layer 112 at a point as deep as the recessed area (i.e., trench, trough, etc.) of the termination region 204.

In another implementation, the channel stopper structure 502 is used with the gate runner structure 402 in a termination region 204 of a transistor structure 100. For example, in one implementation, the channel stopper structure 502 fully or partially surrounds the gate runner structure 402.

Figure 6:
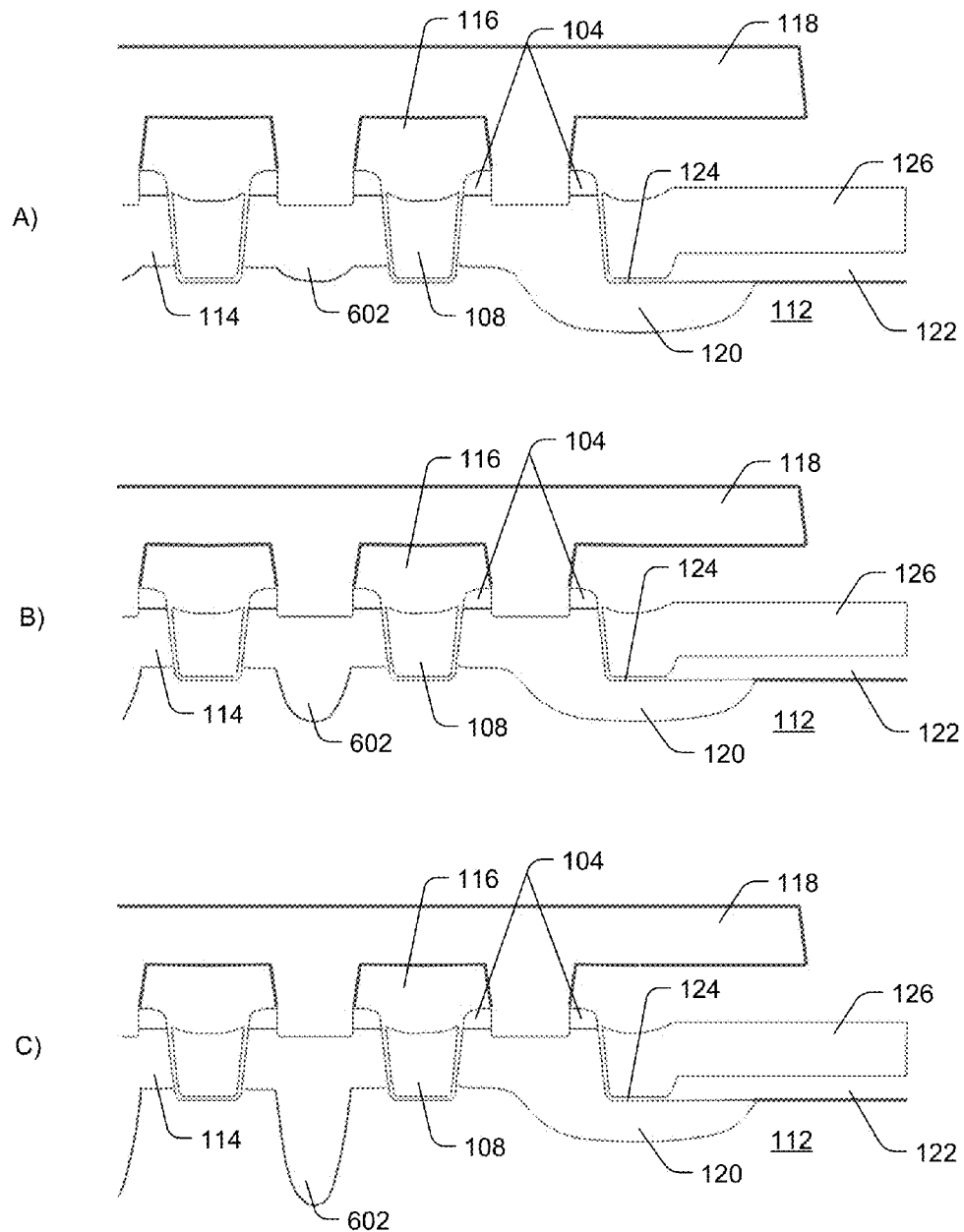
FIG. 6 shows three profile views of a portion of an example transistor structure, according to three similar implementations. The three views show deep body areas in the active region of the transistor structure, at three different depths.

FIG. 6 shows three profile views of a portion of an example transistor structure 100, according to three similar implementations. The three views (A, B, and C) show deep body areas 602 in the active region 202 of the transistor structure, at three different depths. The embodiment combines the deep body region 120 in the termination region 204 with one or more additional deep body regions 602 distributed across the active region 202 of the device. These further deep body regions 602 may have A) a shallower depth than the termination deep body region 120; B) a substantially equal depth as the termination deep body region 120; or C) a deeper depth than the termination deep body region 120. The relative depths of the deep body 602 in the cells 102, the deep body 120 in the termination region 204 and the depths of the active area gate trenches 110 can be independently chosen to optimize device performance.

In an implementation, the one or more deep body portions 602 are arranged to penetrate the semiconductor layer 112 at preselected locations in the active region 202. For example, as shown in FIG. 6, the deep body portions 602 may be located between the gate trench 110 areas, for example. The one or more deep body portions 602 may be arranged to direct current flow through the semiconductor layer 112 at the preselected locations during operation, during breakdown, or the like.

As shown in FIG. 6, at A), an implementation may include a deep body region 120 in the termination region 204 that penetrates the semiconductor layer 112 deeper than the gate trenches 110, which are deeper than the one or more deep body regions 602 in the standard cells 102 of the active region 202.

As shown in FIG. 6, at B), an implementation may include a deep body region 120 in the termination region 204 that penetrates the semiconductor layer 112 at a depth substantially the same as the one or more deep body regions 602 in the standard cells 102 of the active region 202, both being deeper than the gate trenches 110.

As shown in FIG. 6, at C), an implementation may include a deep body region 120 in the termination region 204 that penetrates the semiconductor layer 112 deeper than the gate trenches 110, and one or more deep body regions 602 in the standard cells 102 of the active region 202 that penetrate the semiconductor body deeper than the deep body region 120 in the termination region 204.

Additional implementations may include combinations of gate runner structures 402, channel stopper structures 502, deep body regions 602 (of varying depths) in the active region 202, and one or more deep body regions 120 in the termination region. In one instance, several deep body regions 602 are implemented at a transistor structure 100 that do not have the same depth as each other. Thus, combinations of the features discussed may be designed or engineered for a desired performance characteristic of the transistor structure 100 during operation and/or breakdown.

Example Electric Field Adjustment

Figure 7:
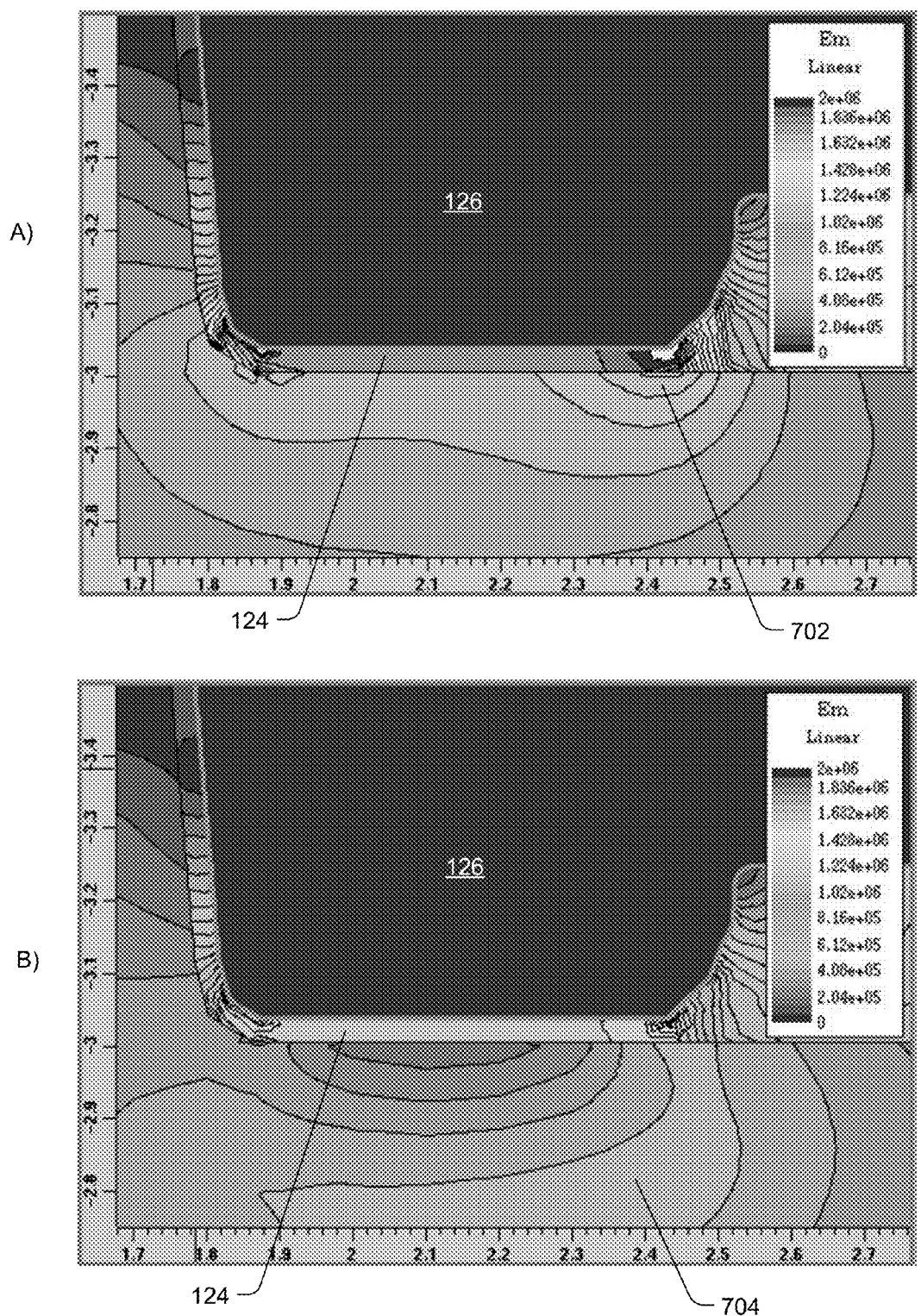
FIG. 7 shows two graphs illustrating the intensity of an electric field created during breakdown, according to an implementation. The first graph shows the electric field without a deep body in the termination region and the second graph shows the electric field with a deep body in the termination region.

FIG. 7 shows two graphs (A and B) illustrating the intensity of an electric field created during breakdown, according to an implementation. The graphs illustrate a portion of the termination region 204 of a transistor structure 100, at the recessed (i.e., trench) area. The first graph at A) shows the electric field intensity without a deep body 120 in the termination region 204 and the second graph at B) shows the electric field with a deep body 120 in the termination region 204.

Referring to FIG. 7, at A), the electric field intensity is shown by the shaded and outlined areas. Without a deep body region 120, there is high electric field intensity in the gate insulator layer 124. The highest field intensity in the semiconductor layer 112, adjacent to the gate insulator is at 702. A high electric field intensity at this location can cause carriers to be injected into the gate insulator 124, compromising the insulating properties of the material and changing the operating parameters of the transistor structure 100. For example, the injected carriers may become trapped in the gate insulator region 124 and cause changes to the breakdown voltage, on-resistance, threshold voltage, and the like. It can also result in a reduced time to breakdown of the insulator in this region or shorten the life of the device.

Referring to FIG. 7, at B), in an implementation, the doping profile in the deep body region 120 (the region below the field plate 126 in the figure) is chosen such that, at the breakdown voltage (BVdss), the space charge region at 704 (highest intensity of electric field) in this deep body region 120 lies entirely below the recessed silicon surface (below the surface of the gate insulator region 124) in the vicinity of the insulator step 122 at the termination region 204. This reduces the electric field across the nearby insulator region that insulates the drain from the gate. Additionally, this enables the avalanche hole current generated in the termination region 204 to flow to the body contact along a path removed from this insulator region 124. In various implementations, this results in improved stability of the device electrical characteristics under repetitive avalanche conditions, and improves the device lifetime. The reduction in electrical field across the gate insulator at 124 in the termination region 204 can also improve the device robustness and resilience to defect induced weaknesses.

Figure 8:
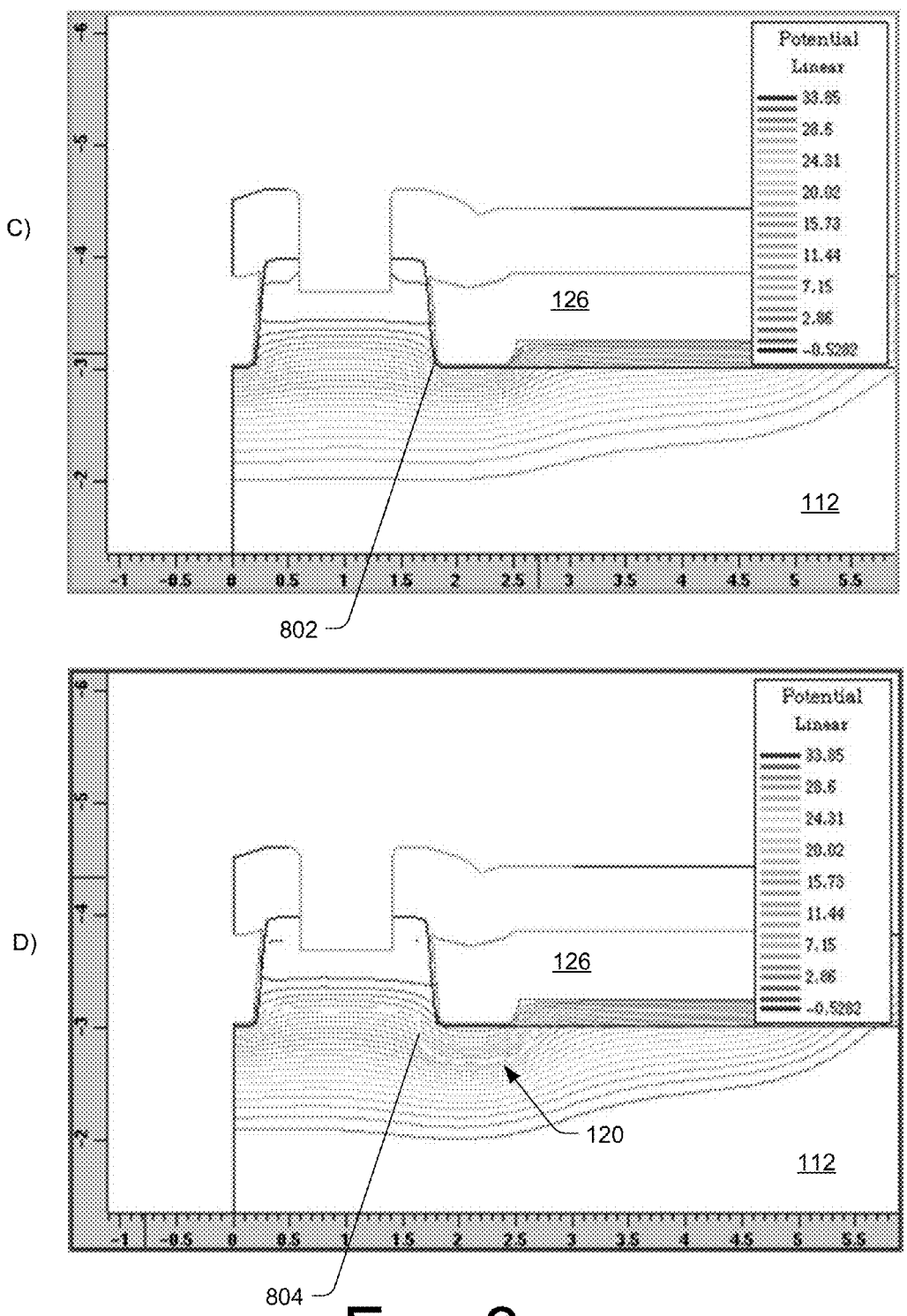
FIG. 8 shows two graphs illustrating electric field equipotential lines, according to an implementation. The first graph shows the equipotential lines without a deep body in the termination region and the second graph shows the equipotential lines with a deep body in the termination region.

FIG. 8 shows two graphs (C and D) illustrating electric field equipotential lines, according to an implementation. The first graph C) shows the electric potential lines without a deep body 120 in the termination region 204 and the second graph D) shows the electric potential lines with a deep body 120 in the termination region 204.

Referring to FIG. 8, at C), the shaded lines represent points of equal electric potential. Regions with more closely spaced equipotential lines indicate regions of high electric field intensity. Without a deep body region 120, there is shown a sharp crowding of equipotential lines around the trench corner at 802, close to gate insulator 124 at that location.

Referring to FIG. 8, at D), in an implementation, the shape, location, and/or doping profile of the deep body region 120 is used to shift the location of the peak electric field (as indicated by the crowding of equipotential lines at 804) away from the edge mesa corner, resulting in a homogeneous distribution of the avalanche current across the entire region. With a deep body region 120, there is a smoother curvature of the equipotential lines around the trench corner close to gate insulator 124.

Example Termination Arrangement Formation:

In various implementations, the deep body region 120 can be introduced into the transistor structure 100 in several ways. In one implementation, the deep body is formed by a high energy implantation prior to trench etching. In another, the deep body is formed by implantation after trench etching has occurred. This may include masking and tilting, for example. In a further implementation, a masked high energy implant may be used at the start of the process, before the formation of the trenches and mesas. In another, a masked low energy implant may be used after formation of the trenches and the mesas.

In a further implementation, the deep body 120 may be formed using a masked implant in conjunction with self-alignment to a step (i.e., the insulator step 122, for example) in the termination insulator after formation of the trenches and the mesas. In another, the deep body 120 may be formed using a masked tilted implant in dual or quad mode, after formation of the trenches and the mesas. In an alternate implementation, the deep body 120 may be formed using a masked tilted implant in dual or quad mode implant, in conjunction with self-alignment to a step (i.e., the insulator step 122, for example) in the termination insulator after formation of the trenches and the mesas.

Figure 9:
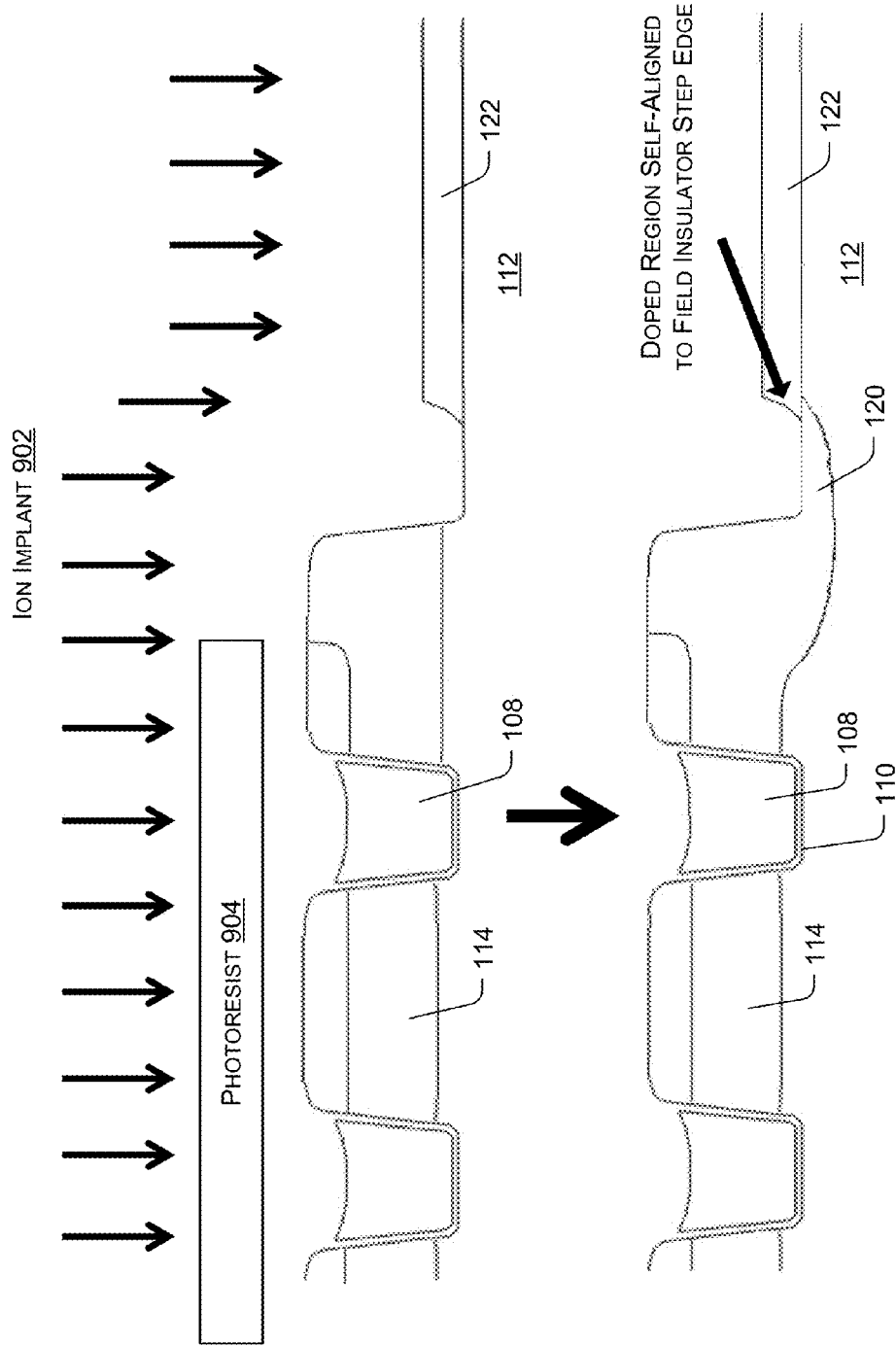
FIG. 9 is a profile view of an example transistor structure, illustrating an ion implant process, according to an implementation.
Figure 10:
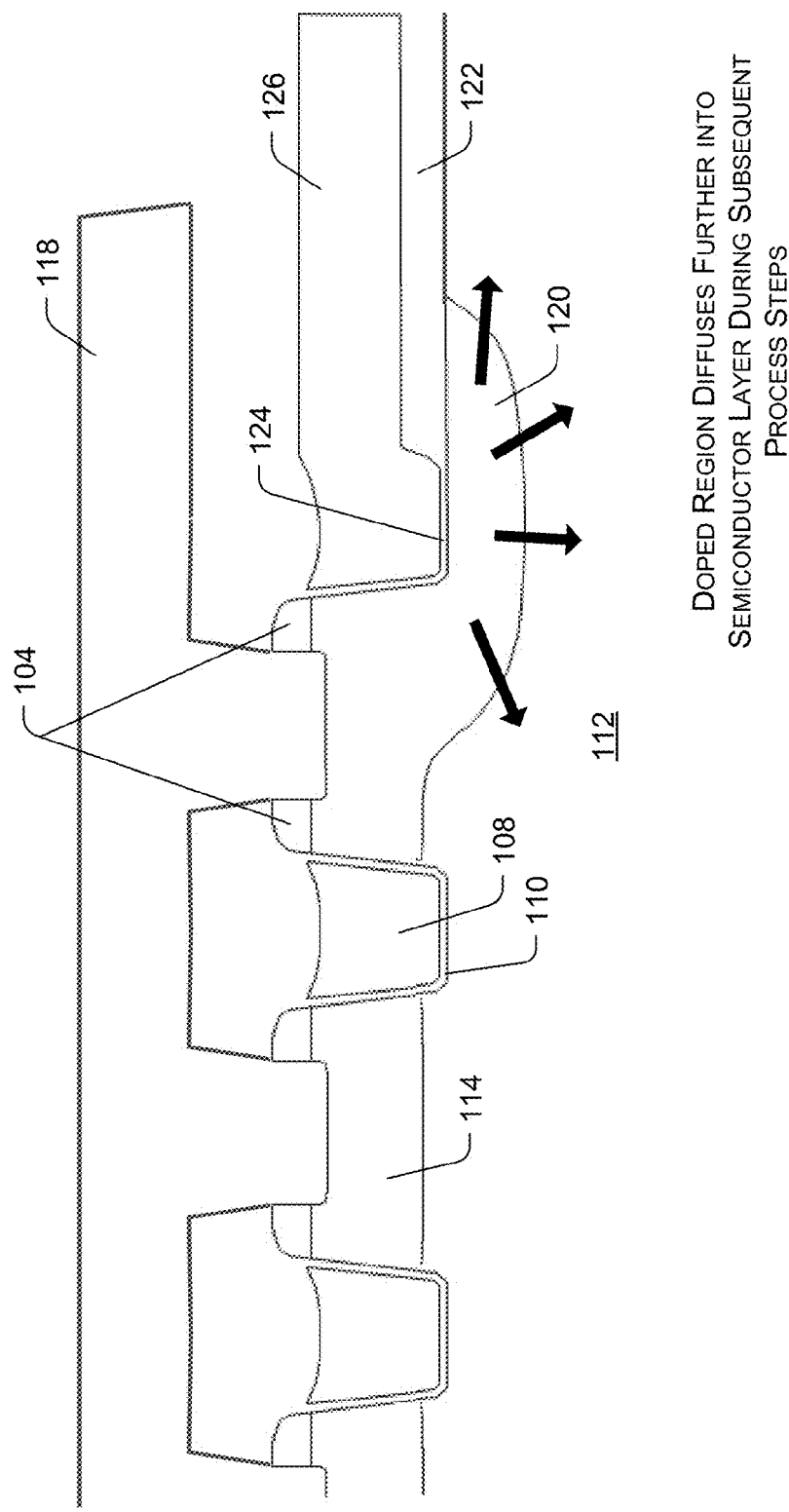
FIG. 10 is a profile view of the example transistor structure of FIG. 9, illustrating a doping diffusion process, according to an implementation.

Referring to FIGS. 9 and 10, in one implementation, the deep body 120 may be formed using an ion implant 902. In one example, trenches are formed within the silicon layer 112, and a thick field insulator region 122 (e.g., 100-500 nm, for example) is formed in the termination region 204 at the edge of the active region 202. The remainder of the semiconductor layer 112 may be free of insulator or may be covered with a thin insulator 124. The source 104 and body 114 regions of the transistor cell 102 may be formed prior to or subsequent to the deep body 120 implant.

In one implementation, photolithography is used to define a resist mask 904, preventing the ion implant 902 from entering the active region 202 of the transistor structure 100. The energy of the ion implant is not sufficient to penetrate the field insulator 122 or photoresist 904. In an implementation, the deep body implant energy is chosen to be high enough to penetrate the thin insulator 124 (if present) and to be insufficiently high to penetrate the thick (field) insulator 122.

The deep body 120 is implanted via the ion implant 902, and the resultant doping profile in the silicon 122 is self-aligned to the field insulator 122, since the field insulator 122 acts like a mask during the implant. Accordingly, the deep body 120 is self-aligned to the field insulator 122 edge during doping.

FIG. 10 illustrates a doping diffusion process, according to an implementation. In one implementation, the self-aligned deep body 120 doping diffuses further into the silicon layer 112 during subsequent process steps. For example, during subsequent processing of the wafer, the deep body 120 will diffuse vertically and horizontally into the semiconductor layer 112, resulting in the final deep body region 120 underlapping the insulator step 122 by a controlled amount.

The insulator structures in the termination region 204 can be formed in several ways. For example, in one implementation, thick field insulator is formed across the width of the termination region 204, then a part of the field insulator is removed in and around the mesa regions. The gate insulator may be formed around the mesa regions by deposition or by thermal oxidation, for example.

Representative Process

Figure 11:
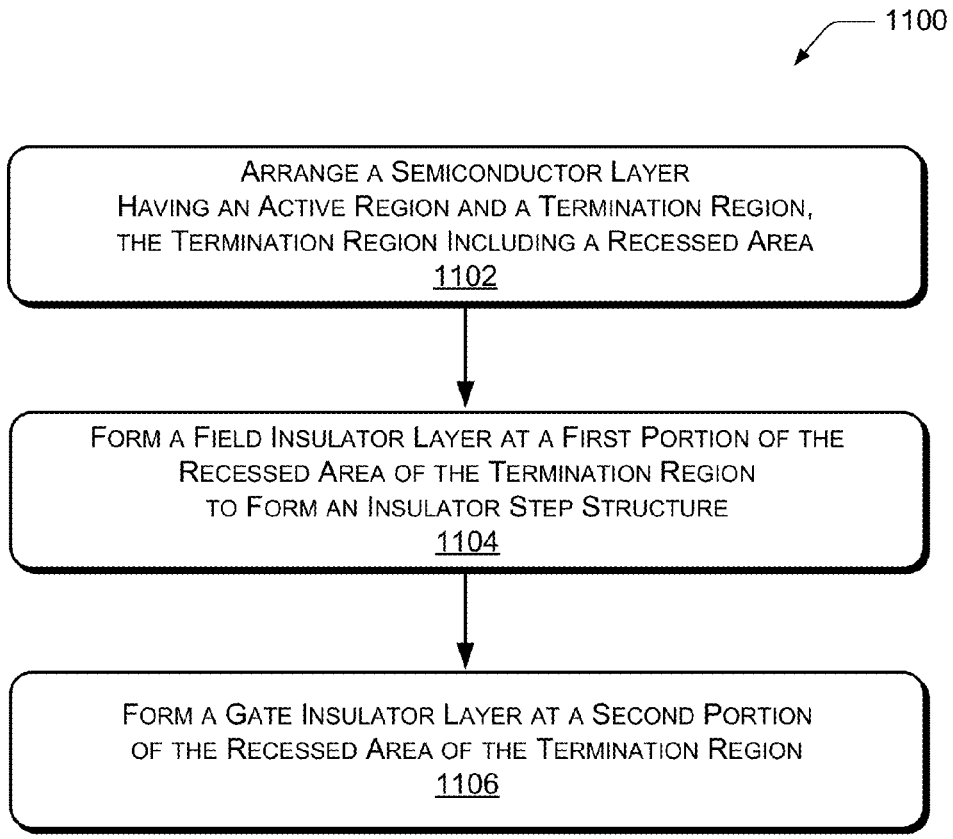
FIG. 11 is a flow diagram illustrating an example process for arranging materials of a transistor structure to modify the electric field at breakdown, according to an implementation.

FIG. 11 illustrates a representative process 1100 for arranging materials in a transistor structure (such as transistor structure 100) to modify an electric field at breakdown. In other words, process 1100 describes forming a termination arrangement, according to an implementation. An example process 1100 includes arranging materials, structures, geometries, and the like in a termination region (such as termination region 204) of a transistor structure. In various implementations, the termination region includes a recessed area or trough. A deep body (such as deep body 120) may be embedded at the recessed area of the termination region. The process 1100 is described with reference to FIGS. 1-10.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 1102, the process includes arranging a semiconductor layer (such as semiconductor layer 112) of a transistor structure. In an implementation, the semiconductor layer has an active region (such as active region 202) and an adjacent termination region (such as termination region 204). In one implementation, the process further comprises removing a portion of the semiconductor layer at the active region to form one or more gate trenches (such as trenches 110). In one example, the gate trenches penetrate the semiconductor layer to a depth substantially equal to a depth of the termination region. In one implementation, the process includes embedding a gate structure (such as gate structure 108) in each of the one or more gate trenches.

In an implementation, the process further comprises forming a source layer on portions of the semiconductor body at the active region. Additionally, in some implementations, the process comprises excluding a source layer from portions of the semiconductor layer at a periphery of the active region.

In an alternate implementation, the process includes removing a portion of the transistor structure at the termination region to form a recessed area. The recessed area may also be a trench, trough, groove, or the like. The portion of transistor structure in the termination region may be removed by etching, for example.

At block 1104, the process includes forming a field insulator layer at a first portion of the recessed area of the termination region, forming an insulator step structure (such as Insulator step 122). For example, the insulator step may be referred to as a thick insulator layer. In one instance, the insulator step extends to the edge of the transistor structure. In one implementation, the field insulator layer may be a silicon oxide layer, and the insulator step structure an oxide step structure. In alternate implementations, the field insulator layer may be comprised of other insulating materials, as described above.

At block 1106, the process includes forming a gate insulator layer at a second portion of the recessed area of the termination region. The second portion of the recessed area may include a sidewall of a cell or mesa, a portion of the semiconductor body surface, and the like. The gate insulator layer may also be referred to as a thin insulator layer. In one implementation, the gate insulator may be a silicon oxide layer. In alternate implementations, the gate insulator layer may be comprised of other insulating materials, as described above.

In an implementation, the process further comprises overlaying the insulator step structure with a conducting or semiconductor field plate structure. The field plate structure may be comprised of polysilicon material, for example.

In another implementation, the process includes implanting a deep body region at the recessed area of the termination region below at least one of the gate insulator layer and the field insulator layer. In one example, the deep body region is located beneath both the gate insulator layer and the field insulator layer. Accordingly, in one case, the deep body region lies beneath a gate insulator/field insulator junction.

In an implementation, the process further comprises changing at least one of a spatial location and a distribution of an electric field formed during an avalanche condition of the transistor structure by modifying one or more dimensions of the deep body at the termination region. For example, the deep body region may extend a distance further towards the edge of the transistor structure if needed. In another implementation, the process comprises modifying a breakdown voltage of the transistor structure by altering a location of the insulator step structure with respect to the deep body region at the termination region.

In an implementation, the process further comprises selecting a doping profile for the deep body region of the termination region such that an electric field produced at a breakdown voltage of the transistor structure is located substantially below a surface of the semiconductor body at the recessed area and below the insulator step structure.

In a further implementation, the process further comprises implanting the semiconductor layer at preselected locations of the active region to form one or more deep body portions in the active region of the semiconductor body. In various examples, the one or more deep body portions have a depth that is substantially equal to or greater than a depth of the deep body region of the termination region. In another example, the one or more deep body portions have a depth that is substantially less than a depth of the deep body region of the termination region.

In various implementations, the process further comprises forming the deep body region using one of several procedures. In one implementation, the process comprises introducing the deep body region at the recessed area of the termination region using a masked high energy implant prior to forming mesas or trenches in the active region and/or termination region. In another implementation, the process comprises introducing the deep body region at the recessed area of the termination region using a masked low energy implant after forming mesas or trenches in the active region and/or termination region.

In a further implementation, the process comprises introducing the deep body region at the recessed area of the termination region using a masked implant in conjunction with a self-alignment to the insulator step structure after forming mesas or trenches in the active region and/or termination region. In an alternate implementation, the process comprises introducing the deep body region at the recessed area of the termination region using a masked tilted implant in dual or quad mode after forming mesas or trenches in the active region and/or termination region.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:
1. A method comprising:
   arranging a semiconductor layer of a transistor structure, the semiconductor layer having an active region and an adjacent termination region, the termination region including a recessed area;
   forming a field insulator layer at a first portion of the recessed area of the termination region to form an insulator step structure at the bottom of the recessed area; and forming a gate insulator layer at a second adjacent portion of the recessed area of the termination region, the gate insulator layer adjoining the insulating step structure at the bottom of the recessed area.

2. The method of claim 1, further comprising implanting a deep body region at the recessed area of the termination region below at least one of the field insulator layer and the gate insulator layer.

3. The method of claim 1, further comprising overlaying the insulator step structure with a field plate structure.

4. The method of claim 1, further comprising:
removing a portion of the semiconductor layer at the active region to form one or more gate trenches, the gate trenches penetrating the semiconductor layer to a depth substantially equal to a depth of the termination region; and
embedding a gate structure in each of the one or more gate trenches.

5. The method of claim 1, further comprising forming a source layer on portions of the semiconductor layer at the active region and excluding a source layer from portions of the semiconductor layer at a periphery of the active region.

6. The method of claim 2, further comprising implanting the semiconductor layer at preselected locations of the active region to form one or more deep body portions in the active region of the semiconductor layer, one or more of the deep body portions having a depth that is substantially equal to or greater than a depth of the deep body region of the termination region.

7. The method of claim 2, further comprising modifying a breakdown voltage of the transistor structure by altering a location of the insulator step structure with respect to the deep body region at the termination region.

8. The method of claim 2, further comprising changing at least one of a spatial location and a distribution of an electric field formed during an avalanche condition of the transistor structure by modifying one or more dimensions of the deep body at the termination region.

9. The method of claim 2, further comprising selecting a doping profile for the deep body region of the termination region such that an electric field produced at a breakdown voltage of the transistor structure is located substantially below a surface of the semiconductor layer at the recessed area and below the insulator step structure.

10. The method of claim 2, further comprising introducing the deep body region at the recessed area of the termination region using a masked high energy implant prior to forming mesas or trenches in the active region and/or termination region.

11. The method of claim 2, further comprising introducing the deep body region at the recessed area of the termination region using a masked low energy implant after forming mesas or trenches in the active region and/or termination region.

12. The method of claim 2, further comprising introducing the deep body region at the recessed area of the termination region using at least one of a masked implant in conjunction with a self-alignment to the insulator step structure or using a masked tilted implant in dual or quad mode, after forming mesas or trenches in the active region and/or termination region.

13. A method comprising:
arranging a semiconductor layer of a transistor structure, the semiconductor layer having an active region and an adjacent termination region, the termination region including a recessed area;
forming a field insulator layer at a first portion of the recessed area of the termination region to form an insulator step structure at the bottom of the recessed area, the step insulator structure being formed as a thickening of the field insulator layer from a first thickness to a second thickness; and
forming a gate insulator layer at a second adjacent portion of the recessed area of the termination region, the gate insulator layer adjoining the insulating step structure at the bottom of the recessed area.

14. The method of claim 13, further comprising overlaying the insulator step structure with a field plate structure.

15. The method of claim 13, further comprising:
removing a portion of the semiconductor layer at the active region to form one or more gate trenches, the gate trenches penetrating the semiconductor layer to a depth substantially equal to a depth of the termination region; and
embedding a gate structure in each of the one or more gate trenches.

16. The method of claim 13, further comprising modifying a breakdown voltage of the transistor structure by altering a location of the insulator step structure.

17. The method of claim 13, further comprising changing at least one of a spatial location and a distribution of an electric field formed during an avalanche condition of the transistor structure.

18. The method of claim 13, further comprising implanting a deep body region at the recessed area of the termination region below at least one of the field insulator layer and the gate insulator layer.

19. The method of claim 18, further comprising introducing the deep body region at the recessed area of the termination region using a masked high energy implant prior to forming mesas or trenches in the active region and/or termination region.

20. The method of claim 18, further comprising introducing the deep body region at the recessed area of the termination region using a masked low energy implant after forming mesas or trenches in the active region and/or termination region.

21. The method of claim 18, further comprising introducing the deep body region at the recessed area of the termination region using at least one of a masked implant in conjunction with a self-alignment to the insulator step structure or using a masked tilted implant in dual or quad mode, after forming mesas or trenches in the active region and/or termination region.

* * * * *